United States Patent [19]
Kinoshita

[11] Patent Number: 6,127,733
[45] Date of Patent: *Oct. 3, 2000

[54] CHECK PATTERN FOR VIA-HOLE OPENING EXAMINATION

[75] Inventor: Yasushi Kinoshita, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/034,697

[22] Filed: Mar. 4, 1998

[30] Foreign Application Priority Data

Mar. 7, 1997 [JP] Japan ................................. 9-053455

[51] Int. Cl.[7] ........................... H01L 23/48; H01L 23/52; H01L 29/40
[52] U.S. Cl. .......................... 257/773; 257/774; 257/621; 257/623
[58] Field of Search .................... 257/774, 621, 257/623

[56] References Cited

U.S. PATENT DOCUMENTS

| | | | |
|---|---|---|---|
| 5,565,697 | 10/1996 | Asakawa et al. | 257/347 |
| 5,619,072 | 4/1997 | Mehta | 257/774 |
| 5,668,413 | 9/1997 | Nanjo | 257/774 |
| 5,721,453 | 2/1998 | Imai et al. | 257/700 |
| 5,825,059 | 10/1998 | Kuroda | 257/301 |
| 5,838,023 | 11/1998 | Goel et al. | 257/48 |

FOREIGN PATENT DOCUMENTS 412531  1/1992  Japan ..................... H01L 21/3205

OTHER PUBLICATIONS

"the National Technology Roadmap for Semiconductors"; p. 98; Table 22: Interconnect Design Ground Rules and Assumptions.

*Primary Examiner*—David Hardy
*Assistant Examiner*—Jhihan B Clark
*Attorney, Agent, or Firm*—Hayes, Soloway, Hennessey, Grossman & Hage, PC

[57] ABSTRACT

To provide a check pattern whereby whether via-hole openings are made correctly or not can be examined without needing high precision positioning of the via-holes, a check pattern of the invention comprises: a check wiring (3) configured on a semiconductor substrate (2), an insulation film (4) formed on the semiconductor substrate (2) to cover the check wiring; and a pair of via-holes (6) each configured at each end of the check wiring (3), said each (6) positioned slightly shifted inversely with each other from a center line in a width direction of the check wiring (3), and a bottom of said each (6) being positioned to traverse both the check wiring (3) and the insulation film (4).

6 Claims, 8 Drawing Sheets

- 104 : RESIST PATTERN
- 105 : VIA-HOLE
- 105a : STEP
- 103 : INTER-LAYER INSULATION FILM
- 102 : LOWER LAYER WIRING
- 101 : SEMICONDUCTOR SUBSTRATE

- 204 : RESIST PATTERN
- 205 : VIA-HOLE
- 205a : STEP
- 203 : INTER-LAYER INSULATION FILM
- 202 : LOWER LAYER WIRING
- 201 : SEMICONDUCTOR SUBSTRATE

CHECK PATTERN FOR VIA-HOLE OPENING EXAMINATION

BACKGROUND OF THE INVENTION

The present invention relates to a check pattern to be used for opening examination of via-holes configured on a semiconductor substrate having multi-layer wirings.

In Japanese patent application laid open as a Provisional Publication 12531/'92, there is disclosed a check pattern to be used for examining whether via-holes are correctly configured on a semiconductor substrate or not. FIG. 11 is a cross section schematically illustrating the prior check pattern disclosed in the aforesaid patent application.

Referring to FIG. 11, a prior check pattern comprises more than one wiring 102 configured neighboring each other on a lower layer provided on a semiconductor substrate 101, an inter-layer insulation film 103 configured on the semiconductor substrate 101 covering the wirings 102, a resist pattern 104 configured on the inter-layer insulation film 103, and a via-hole 105, a bottom thereof having a step 105a traversing the wirings 102 and the inter-layer insulation film 103 between the wirings 102.

By surveying the via-hole 105 with a scanning electron-microscope, it is confirmed that the via-hole 105 is correctly configured so that the bottom of the via-hole 105 extends to the surface of the wirings 102, when a contrast between a light part owing to the wirings 102 and a dark part owing to the step 105a is observed.

Thus, whether the via-hole 105 is correctly configured or not can be discriminated by whether a contrast is observed or not when the via-hole 105 is surveyed by a scanning electron-microscope.

FIG. 12 is a cross section illustrating another example of a prior check pattern, wherein more than one wirings 202 configured neighboring each other on a lower layer provided on a semiconductor substrate 201, an inter-layer insulation film 203 configured on the semiconductor substrate 201 covering the wirings 202, a resist pattern 204 configured on the inter-layer insulation film 203, and a via-hole 205, a bottom thereof having a step 205a traversing at least one of the wirings 202 and the inter-layer insulation film 203 between the wirings 202 are depicted.

In the check pattern of FIG. 12, whether the via-hole 205 is correctly configured or not can be discriminated by whether a contrast can be observed or not when the via-hole is surveyed with a scanning electron-microscope, as well as in the check pattern of FIG. 11, on condition the via-hole 205 is so configured that the bottom thereof may traverse both of at least one of the wirings 202 and the inter-layer insulation film 203 between the wirings 202.

Therefore, in the prior art, the diameter of the via-hole is preferably designed to be longer than the spacing between the wirings.

However, as integration of semiconductor circuit becomes higher and higher recently, standardization concerning standards for semiconductor devices such as wiring widths and spacings is being promulgated.

For example, in p. 98 of a publication of SIA (Semiconductor Industry Association) entitled "The National Technology Roadmap for Semiconductors", there is described a "table 22: Interconnect Design Ground Rules and Assumptions" showing design rules of aluminum wirings, wherein wiring width, wiring spacing and via-hole size of 0.35 μm-rule devices are defined to be 0.4 μm, 0.6 μm and 0.4 μm, respectively. Furthermore, it is assumed according to the document that the wiring width, the wiring spacing and the via-hole size of future 0.1 μm-rule devices will be defined as 0.11 μm, 0.16 μm and 0.11 μm, respectively.

Hence, according to the above standard, the bottom of the via-hole of the check pattern for the opening examination of via-holes can not be designed to traverse two wirings as in the prior check pattern of FIG. 11.

Further, it also will become very difficult to configure the bottom of the via-hole of the check pattern to traverse both of at least one of the wirings and the inter-layer insulation film between them such as in the prior check pattern of FIG. 12. It is because the via-hole size becomes very fine and there is a limit in preciseness of positioning for configuring the via-hole, and so, the via-hole bottom may not traverse both the wiring or the inter-layer insulation film. Even if the via-hole bottom can be configured to traverse both of the wiring and the inter-layer insulation film, the relative proportion of either of them may often become far smaller than the other. In such case, no contrast may be observed when the via-hole is surveyed with the scanning electron-microscope, and consequently, the via-hole may be regarded not to be configured sufficiently even if it is made correctly.

Therefore, extremely high-precision positioning will become necessary for configuring the via-hole, in order to prevent mal-configuration of via-holes according to a prior check pattern.

Furthermore, there is a problem that a mal-configured via-hole may be regarded to be made correctly when electron beam of the scanning electron-microscope surveying the via-hole is not vertically incident to the via-hole bottom, by mistaking a shadow of the electron beam as the dark part owing to the inter-layer insulation film.

As to the reason the electron beam is not incident vertically to the via-hole bottom, there can be considered cases such as the electron gun of the scanning electron-microscope is not adjusted sufficiently or warp is found in the semiconductor substrate. The warp of the semiconductor substrate is easily caused in a wiring patterning process because high-speed thermo-processes such as the lamp-anneal method have been frequently performed in the substrate preparing procedure before the wiring patterning process.

Furthermore, when the aspect-ratio (ratio of depth to width) of the via-hole becomes comparatively large, no incident election beam may reach the bottom of the via-hole, resulting in further inconvenience of the electron beam not incident vertically to the via-hole bottom. In this connection, the aspect-ratio of the via-hole is defined, in the above document, as 2.5 to 4.5 for the 0.35 μm-rule devices, and assumed to become 5.2 to 9 for the future 0.1 μm-rule devices.

In either case, it is needed to re-adjust the electron gun of the scanning electron-microscope when the electron beam is not incident vertically to the via-hole bottom, and the necessity of the re-adjustment operation has been one of the causes to degrade efficiency of the via-hole opening examination.

SUMMARY OF THE INVENTION

Therefore, a primary object of the present invention is to provide a check pattern whereby whether via-hole openings are made correctly or not can be examined without needing high precision positioning for configuring via-holes of the check pattern.

Another object of the invention is provide a check pattern for the via-hole opening examination wherein whether electron beam of a scanning electron-microscope for surveying the via-holes is vertically incident or not to via-hole bottoms can be easily detected.

In order to achieve the object, a check pattern of the invention for examining via-hole openings comprises:

a check wiring configured on a semiconductor substrate whereof via-hole openings are to be examined;

an insulation film formed on the semiconductor substrate to cover the check wiring; and a pair of via-holes each configured at each end of the check wiring, said each positioned a little shifted inversely with each other from a center line of the check wiring in a width direction of the check wiring, and a bottom of said each being positioned to traverse both the check wiring and the insulation film.

Therefore, the bottom of at least one of the pair of via-holes may traverse both the check wiring and the insulation film even when the pair of via-holes is configured with a certain deviation from a desired position because of dispersion of positioning, even if the diameter of the via-holes is less than the wiring spacing.

Furthermore, it is only when size of the check wiring in the bottom of each of the pair of via-holes is the same with each other that the same contrast is observed for each of the pair of via-holes when they are surveyed by the scanning electron microscope, on condition that the electron beam is incident vertically to the bottoms of the pair of via-holes. Therefore, by comparing the contrast between each of the pair of via-holes, it can be easily confirmed whether the electron beam is incident vertically or not to the bottoms of the pair of via-holes, in the invention.

Another check pattern of the invention for examining via-hole openings comprises:

more than one check wiring configured being arranged in series by a first pitch on a semiconductor substrate whereof via-hole openings are to be examined;

an insulation film formed on the semiconductor substrate to cover said more than one check wiring; and pairs of via-holes, arranged in series by a second pitch different from the first pitch, each corresponding to each of said more than one check wiring, each via-hole of every of the pairs of via-holes configured at each end of corresponding each of said more than one check wiring, said each via-hole positioned slightly shifted inversely with each other from a center line of the corresponding each of said more than one check wiring in a width direction of the corresponding each of said more than one check wiring, and a bottom of said each via-hole being positioned to traverse both the corresponding each of said more than one check wiring and the insulation film.

Therefore, by surveying contrast differences among either side via-holes of the pairs of via-holes, the correct configuration of the via-holes can be more surely confirmed eliminating mis-recognition of the contrasts caused by shadows owing to a slanted electron beam.

Still another check pattern of the invention for examining via-hole openings comprises an additional check wiring at a lower wiring layer than a wiring layer of the check wiring, said additional check wiring being so positioned that a bottom of one of the pair of the via-holes should traverse both the check wiring and the additional wiring when the pair of the via-holes is over-etched excessively.

Therefore, excessive over-etching of the via-holes can be easily detected by surveying the pair of the via-holes with the scanning electron-microscope, since no contrast is observed in said one of the pair of via-holes when the via-holes are too over-etched.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1A:
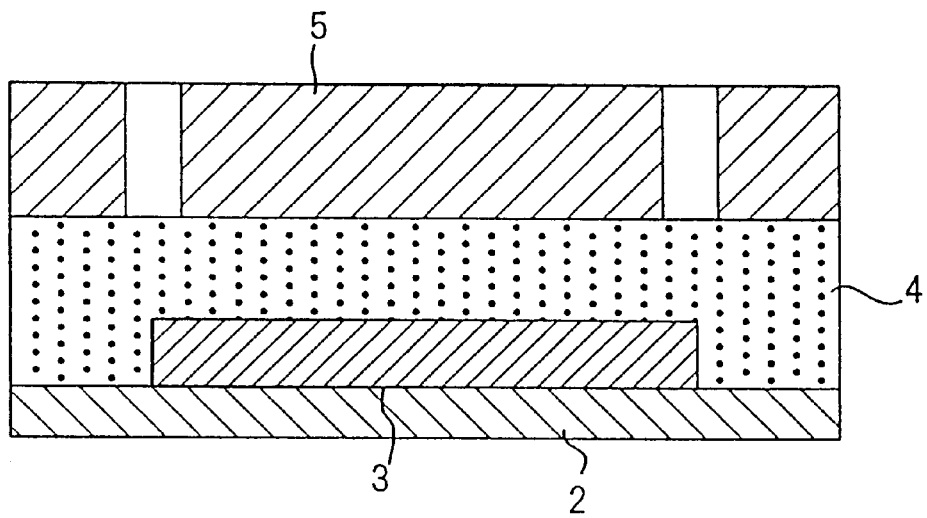
FIGS. 1A and 1B are cross sections illustrating configuration procedure of a check pattern according to a first embodiment of the invention.
Figure 1B:
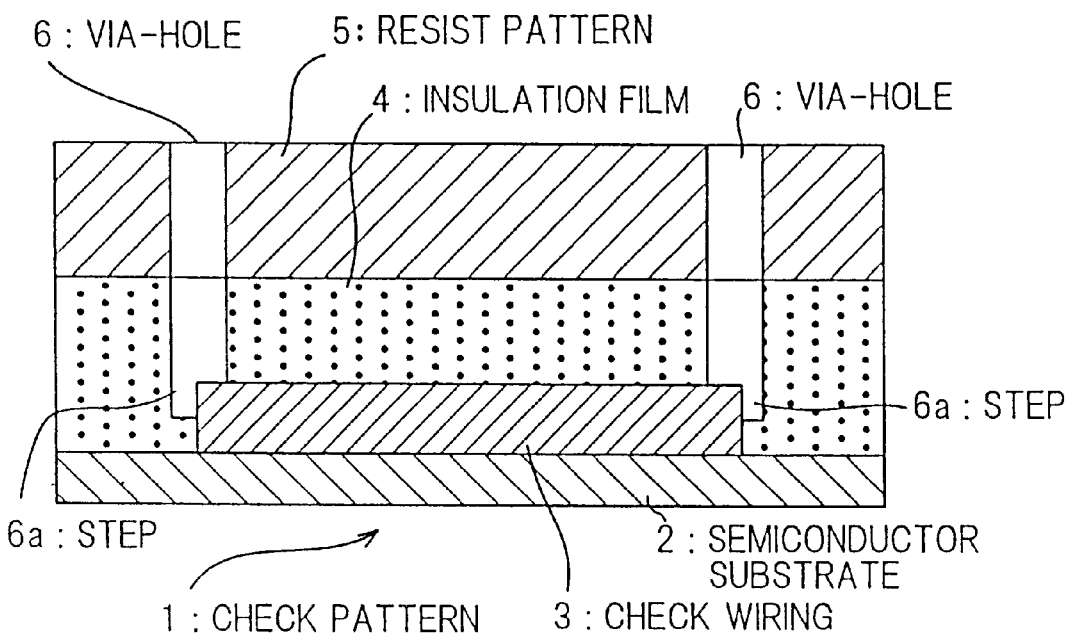
Figure 2:
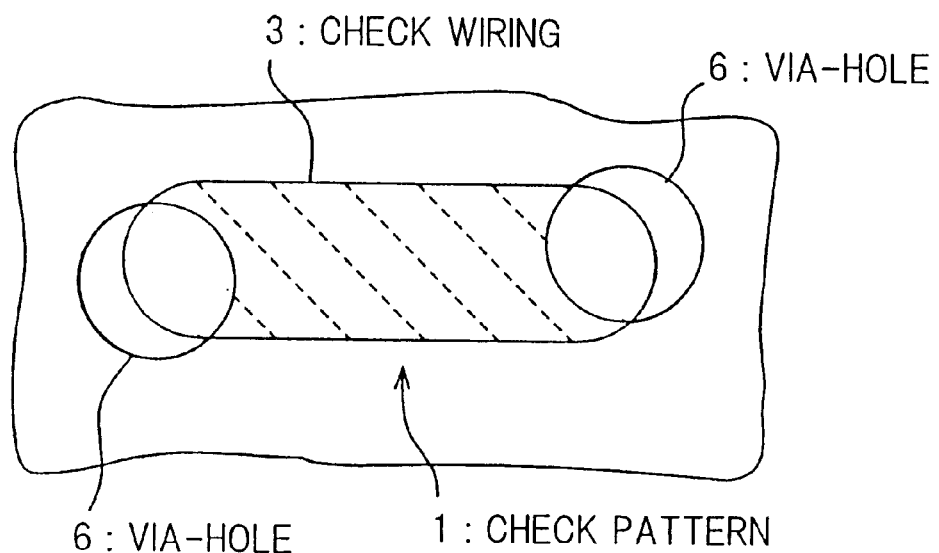
FIG. 2 is a plan view illustrating upper surface of the check pattern of FIG. 1B.

FIGS. 1A and 1B are cross sections illustrating configuration procedure of a check pattern according to a first embodiment of the invention to be applied for opening examination of via-holes, and FIG. 2 is a plan view illustrating upper surface of the check pattern of FIG. 1B.

As shown in FIG. 1B, the check pattern 1 for opening examination of via-holes comprises a check wiring 3 configured on a semiconductor substrate 2 to be used for opening examination of a pair of via-holes 6. The check wiring 3 is formed at the same time with wirings of integrated circuits (not depicted in the drawings) configured on the semiconductor device 2, but it is not a member of the integrated circuits, and hence, it can be patterned anywhere on the semiconductor substrate 2.

There are further comprised an insulation film 4 formed on the check wiring 3 and a resist pattern 5 formed on the insulation film 4. As seen in FIGS. 1A and 1B and FIG. 2, a pair of via-holes 6 is configured for one check wiring 3 so that bottoms thereof traverse both the check wiring 3 and the insulation film 4, and so that, at the same time, each of the pair of via-holes 6 positions at each end of the wiring 3 is slightly shifted inversely with each other from the center line in a width direction of the wiring 3.

The size of overlapped area of the bottom of the via-hole 6 and the check wiring 3, or the size of the check wiring 3 in the bottom of the via-hole 6, is determined by the diameter of the via-hole 6 and the preciseness for positioning the via-hole 6. For example, when a via-hole 6 having a diameter of 0.5 $\mu$m is positioned so as to give an overlapped area of 0.3 $\mu$m with a positioning preciseness of ±0.1 $\mu$m, the overlapped area should become 0.2 $\mu$m to 0.4 $\mu$m. Therefore, size of the overlapped area of each via-hole 6 may not be the same.

As to the diameter of the via-hole 6, it is preferable to be designed as the same with a smallest via-holes among those used for the integrated circuits configured on the semiconductor substrate 2. When the via-hole 6 of the check pattern 1 is configured to have the same size with the smallest via-hole of the integrated circuits, the other via-holes of the integrated circuits can be also regarded to be configured at worst on the same condition of the via-hole 6 of the check pattern 1. Therefore, via-hole openings of the integrated circuits can be examined to be made correctly when opening of the via-hole 6 is confirmed to be made correctly by observing the via-hole 6 of the check pattern 1.

Now, processes for configuring the check pattern 1 are described.

First, the check wiring 3 is formed besides the integrated circuits at a desired position on the semiconductor substrate 2, as shown in FIG. 1A. Then the insulation film 4 is formed on the check wiring 3, whereof a surface is made flat by etch-back or CMP (Chemical-Mechanical Polishing) processing. Then, the resist pattern 5 is formed on the insulation film 4, except for areas where the pair of via-holes 6 are to be configured afterwards. Then, finally, the insulation film 4 is etched making use of the resist pattern 5 as a mask, to make the pair of via-holes 6. Thus the check pattern 1 is accomplished.

Figure 3:
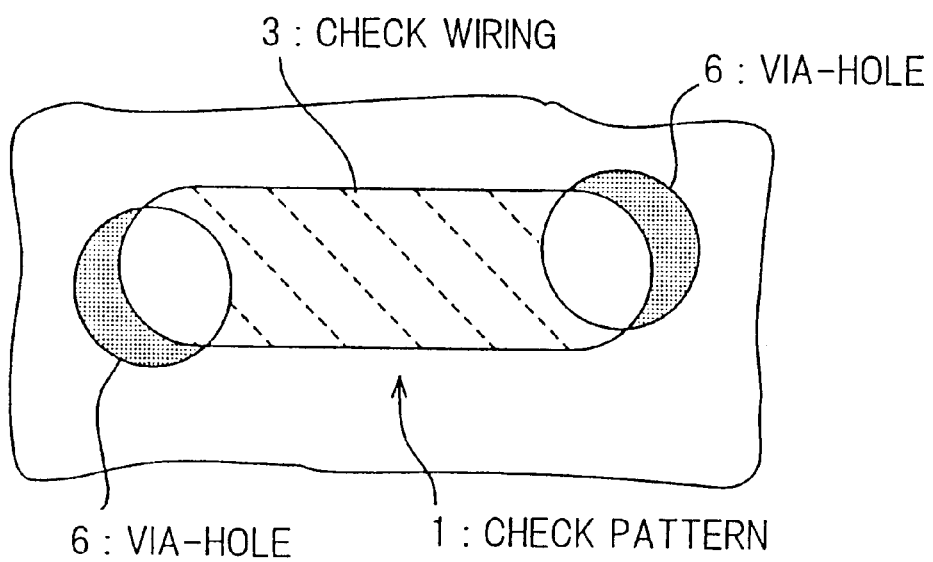
FIG. 3 is a plan view illustrating contrasts of the check pattern 1 of FIG. 1B to be observed by a scanning electron-microscope.

Usually, the insulation film 4 is a little over etched when configuring via-holes, and hence, insulation film 4 of the bottom of the via-hole 6 is also etched until a position a little lower than the upper surface of the check wiring 3, giving a step 6a between the upper surface of the check wiring 3 and the surface of the insulation film 4 in the bottom of the pair of via-holes 6. When the check pattern 1 thus configured is surveyed by a scanning electron-microscope, contrasts as illustrated in FIG. 3 can be observed between a light part owing to the check wiring 3 and a dark part owing to the step 6a.

As heretofore described, each of the pair of via-holes 6 is provided at both ends of the check wiring 3, configured slightly shifted inversely with each other from the center line in the width direction of the wiring 3, in the check pattern 1 according to the embodiment. Hence, the bottom of at least one of the pair of via-holes 6 traverses both the check wiring 3 and the insulation film 4 when the pair of via-holes 6 is configured within a certain deviation because of dispersion of positioning from a desired position, even if the diameter of the via-holes is restricted shorter than the wiring interval. Therefore, whether openings of the pair of via-holes 6 are correctly made or not can be easily examined without needing high-precision positioning of the pair of via-holes 6, in the check pattern 1 of the embodiment.

Furthermore, it is only when size of the check wiring 3 in the bottom of each of the pair of via-holes 6 is the same with each other that the same contrast is observed for each of the pair of via-holes 6 when surveyed by the scanning electron microscope, on condition that the electron beam is incident vertically to the bottoms of the pair of via-holes 6. Therefore, by comparing the contrast between each of the pair of via-holes 6, it can be easily confirmed whether the electron beam is incident vertically or not to the bottoms of the pair of via-holes. Thus, the mis-recognition can be also prevented that the via-hole openings be made correctly by mistaking contrast caused by shadow of the electron beam as the contrast owing to the wiring surface exposed in the bottoms of the pair of via-holes 6.

In the following paragraphs, another application of the check pattern 1 described in connection with FIGS. 1A and 1B to FIG. 3 will be described referring to FIG. 4, wherein a plan view of upper surface of a check pattern 11 for examining via-hole openings is illustrated.

Figure 4:
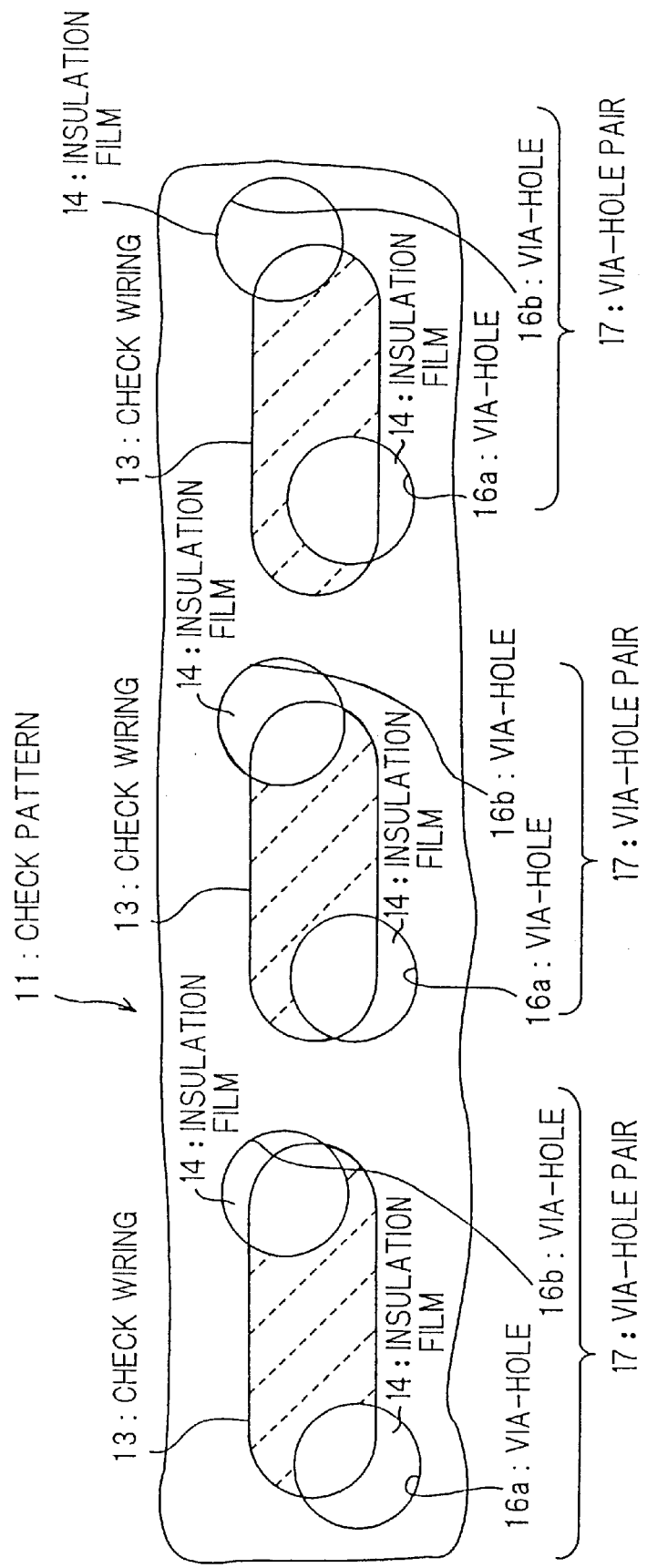
FIG. 4 is a plan view illustrating another check pattern 11 of the first embodiment.

Referring to FIG. 4, more than one check wiring 13 are configured arranged in series with a certain pitch, each provided with each pair 17 of via-holes 16a and 16b. Also in this application, bottoms of the via-holes 16a and 16b are designed to traverse both the check wirings 13 and an insulation film 14, in a similar way with the check pattern 1 of FIG. 1. Further, in each pair 17, each of the via-holes 16a and 16b is positioned at each end or near of a corresponding check wiring 13 being slightly shifted inversely from a center line in a width direction of the concerning check wiring 13.

The via-hole pairs 17 are also ranged in series in the same direction with the check wirings 13 with a fixed and slightly different pitch with the pitch of the check wirings 13. In the example of FIG. 4, the pitch of the via-hole pairs 17 is slightly larger than that of the check wirings 13. Here, it is preferable that a center of one of the via-hole pairs 17 is designed to be the same with center of corresponding check wiring 13.

Each of the check wirings 13, corresponding pair 17 of via-holes 16a and 16b, the insulation film 14, a resist pattern (not depicted in the drawings), or steps (not depicted in the drawings) on the bottoms of the via-holes 16a and 16b are configured in the similar way as described in connection with the check pattern 1, and duplicated descriptions are omitted.

Figure 5:
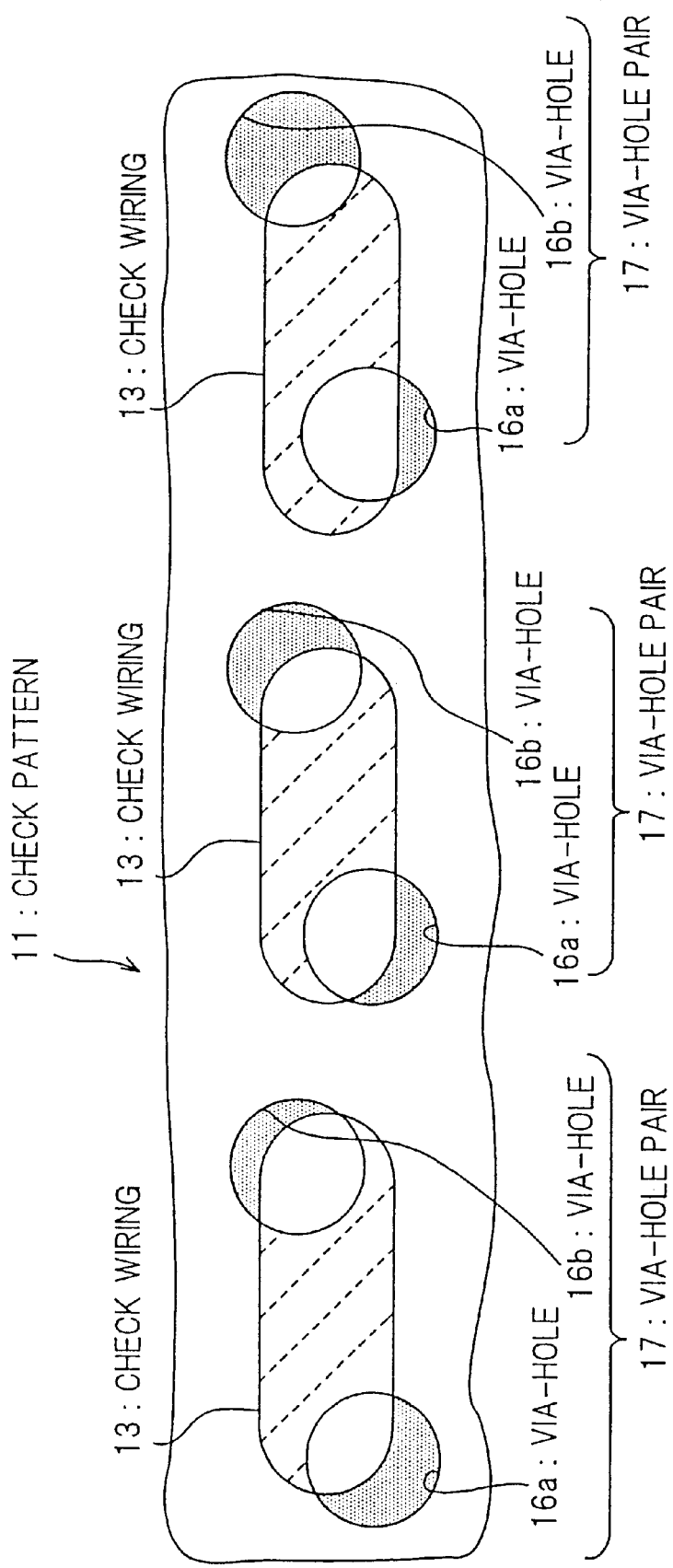
FIG. 5 is a plan view illustrating contrast differences among via-holes of each pairs 17 of the check pattern 11 of FIG. 4 as observed by a scanning electron-microscope.

However, in the check pattern 11 of FIG. 4, each of the sizes of overlapped areas of the check wirings 13 and bottoms of left side via-holes 16a should be configured to be different with each other. Therefore, when the left side via-holes 16a are surveyed by the scanning electron-microscope, there should be positively observed differences of light/dark rate of contrasts among the left side via-holes 16a owing to size differences of the overlapped areas, on condition that the electron beam of the scanning electron-microscope is incident vertically to the via-hole bottoms. It is the same with the right side via-holes 16b, as illustrated in FIG. 5.

Thus, by surveying contrast differences among the left side via-holes 16a or the right side via-holes 16b, the correct configuration of the via-holes can be positively confirmed eliminating the mis-recognition of the contrasts caused by shadows owing to a slanted electron beam.

Also ill the check pattern 11 of FIG. 4, each of the via-holes 16a and 16b is positioned at each end or near of a corresponding check wiring 13 being slightly shifted inversely from a center line in a width direction of the concerning check wiring 13, in the same way with the check pattern of FIG. 1.

Figure 6:
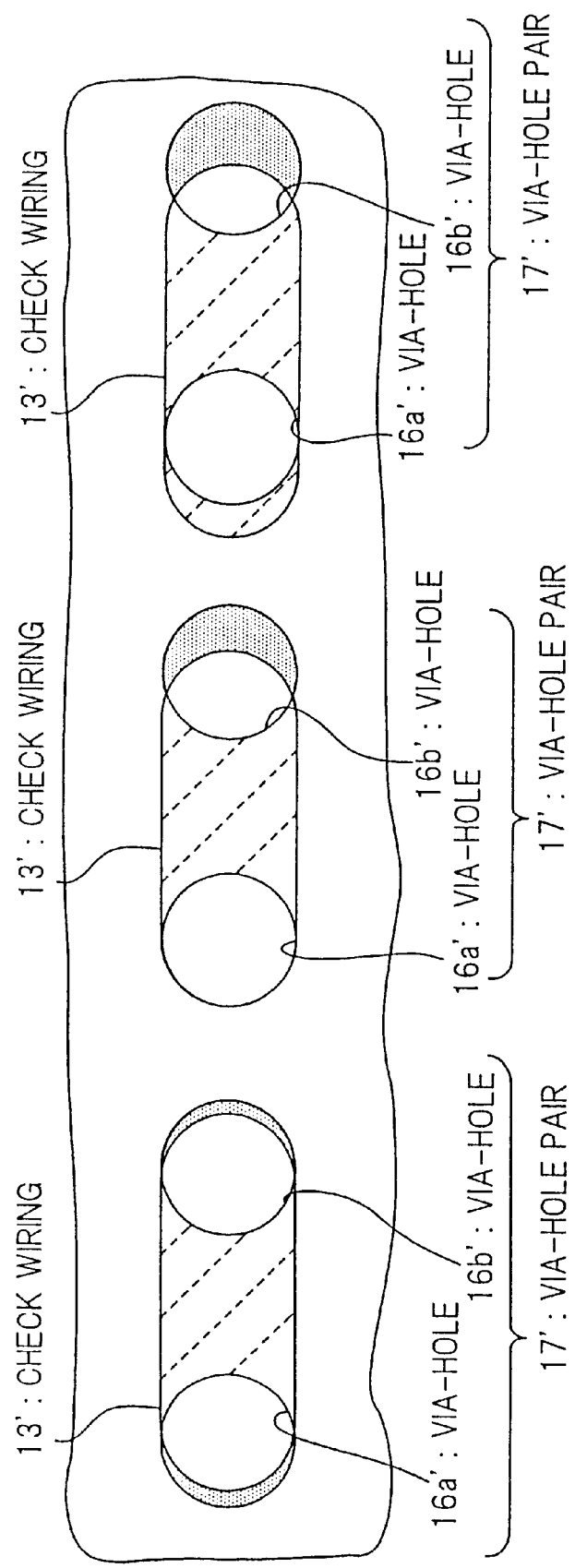
FIG. 6 is a plan view illustrating contrast differences as observed when the pairs 17' of via-holes are configured in parallel to the check wirings 13'.

It is because that openings of some via-holes may be made entirely on a check wiring 13' in case where diameter of the via-holes is equal or smaller than width of the check wiring 13', if the via-holes are positioned without shifting as via-holes 16a' and 16b' as illustrated in FIG. 6, resulting in no contrast to be observed.

Now, a second embodiment of the present invention will be described.

Figure 7A:
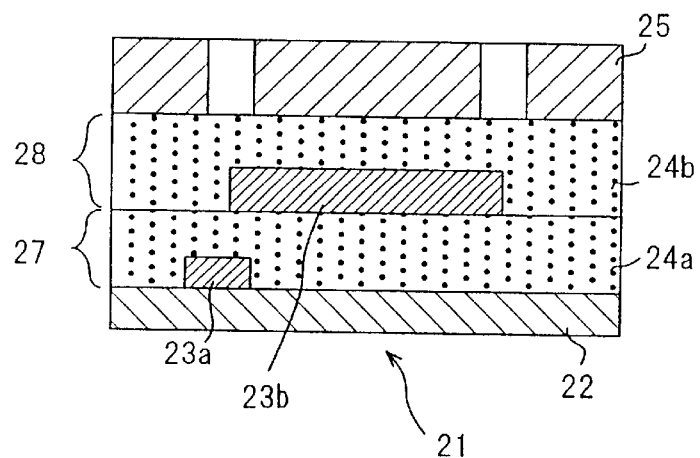
FIGS. 7A and 7B are cross sections illustrating configuration procedure of a check pattern 21 according to a second embodiment of the invention.
Figure 7B:
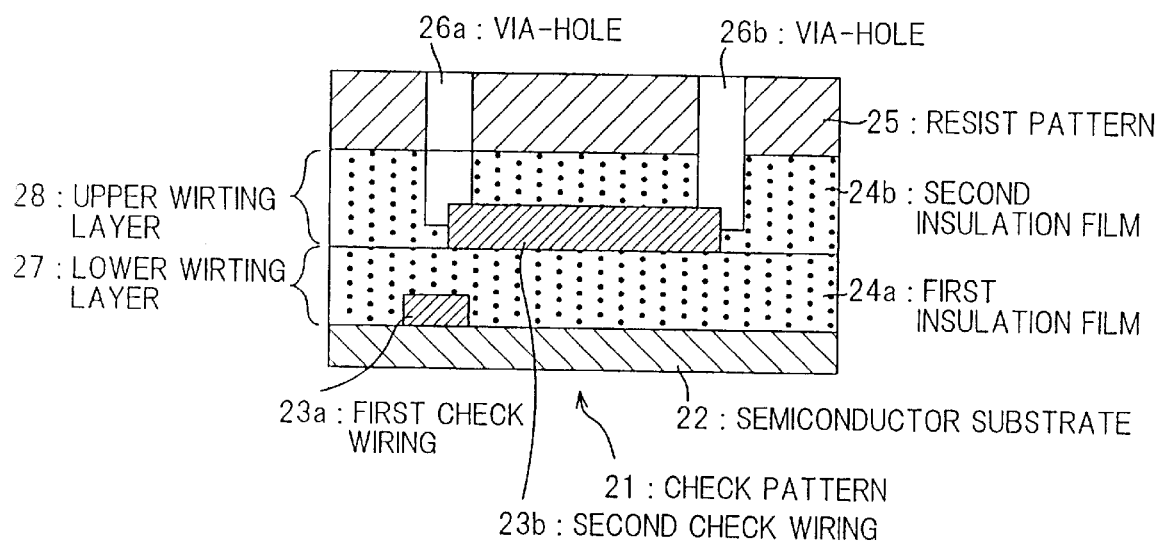

FIGS. 7A and 7B are cross sections illustrating configuration procedure of a check pattern 21 according to the second embodiment of the invention to be applied for opening examination of via-holes.

As shown in FIG. 7B, two wiring layers 27 and 28 is provided in the check pattern 21. The lower wiring layer 27 comprises a first check wiring 23a configured on a semiconductor substrate 22 to be used for examining openings of a pair of via-holes 26a and 26b and a first insulation film 24a formed to cover the first check wiring 23a. The first check wiring 23a is formed at the same time with wirings of the lower wiring layer 27 of integrated circuits (not depicted in the drawings) configured on the semiconductor device 22, but it is not a member of the integrated circuits, and hence, it can be patterned anywhere on the semiconductor substrate 22. The tipper wiring layer 28 comprises a second check wiring 23b which is provided separately from circuit wirings of the upper wiring layer 28 in a similar way with the first check wiring 23a and a second insulation film 24b formed to cover the second wiring 23b. On the upper wiring layer 28, a resist pattern 25 is configured.

One of the pair of via-holes, the via-hole 26a, for example, is positioned so that a bottom thereof traverses both the first check wiring 23a and the second check wiring 23b when the via-hole is over-etched excessively. Each of the via-holes 26a and 26b is preferably designed so that each size of the second check wirings 23b in each bottom of the via-holes 26a and 26b is the same with each other.

Now, details of the configuration procedure of the check pattern are described here.

For the first, the first check wiring 23a is configured on the semiconductor substrate 22 as shown in FIG. 7A. The first check wiring 23a is not a member of the integrated circuits and may be provided anywhere on the surface of the semiconductor substrate 22 from a conductive material such as polycrystalline silicon. Then, the first wiring layer 27 is finished by forming the first insulation film 24a to cover the first check pattern 23a, which is made flat by the etch-back method or the CMP method. Then, the second check wiring 23b is configured on the first insulation film 24a, and the second insulation film 24b is formed and made flat in the same way as above described for configuring the second wiring layer 28, which is followed by the resist pattern 25 formed on the second insulation film 24a except for positions where the via-holes 26a and 26b are to be configured afterwards. Then finally, the via-holes 26a and 26b are configured by etching the second insulation film 24b making use of the resist pattern 25 as the mask for the etching in order to accomplish the check pattern 21 as shown in FIG. 7B.

The check pattern 21 is described to comprise two wiring layers 27 and 28. However, the number of wiring layers is not limited into two and the number of wiring layers may be more when they are necessary.

Figure 8:
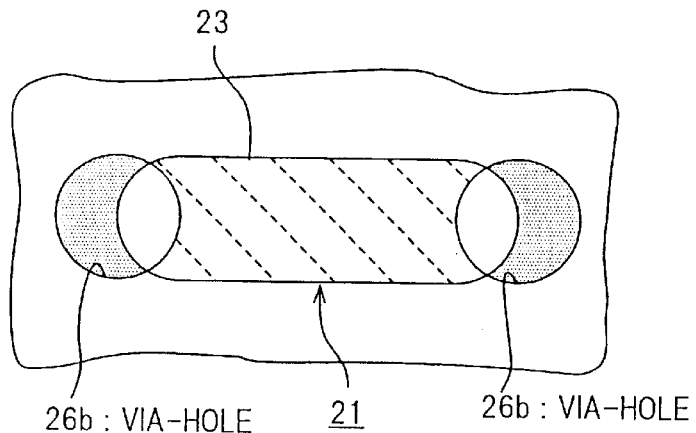
FIG. 8 is a plan view illustrating contrast differences as observed when the via-holes 26a and 26b of the check pattern 21 of FIG. 7B are configured correctly.

When the check pattern 21 is surveyed with a scanning electron-microscope, equal contrasts are observed for both of the via-holes 26a and 26b, when both bottoms thereof are traversing the second check wiring 23b and the second insulation film 24b, as illustrated in FIG. 8 wherein the first check wiring 23a is not exposed.

Figure 9:
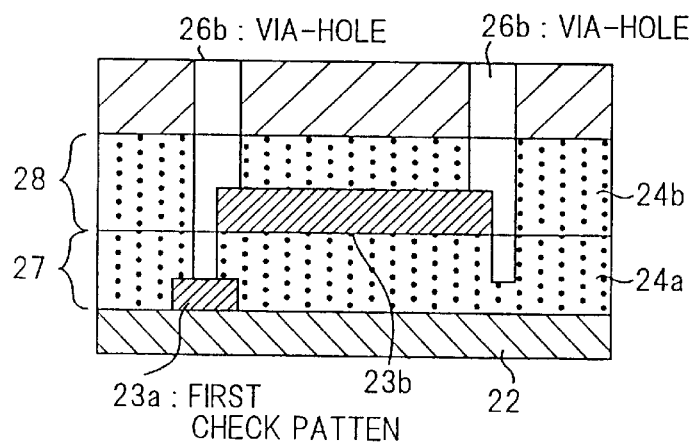
FIG. 9 is a cross section illustrating contrast of the via-holes 26a and 26b of the check pattern 21 of FIG. 7B when they are over-etched excessively.
Figure 10:
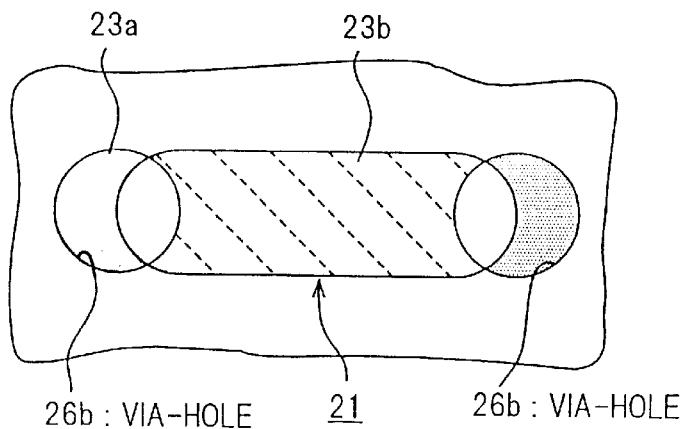
FIG. 10 is a plan view illustrating contrast differences as observed when the via-holes 26a and 26b are over-etched excessively.
Figure 11:
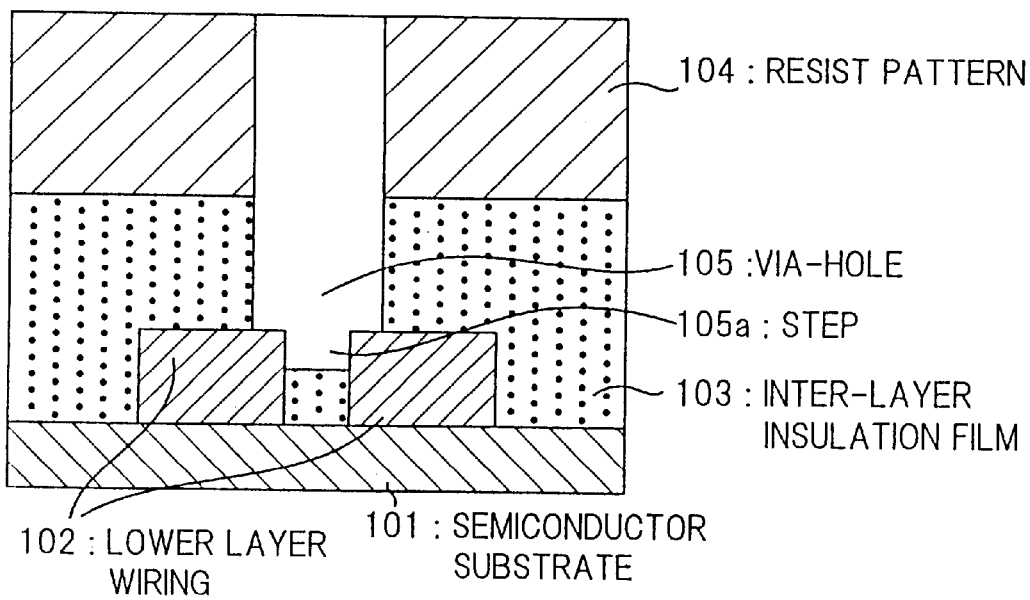
FIG. 11 is a cross section illustrating an example of a prior art check pattern.
Figure 12:
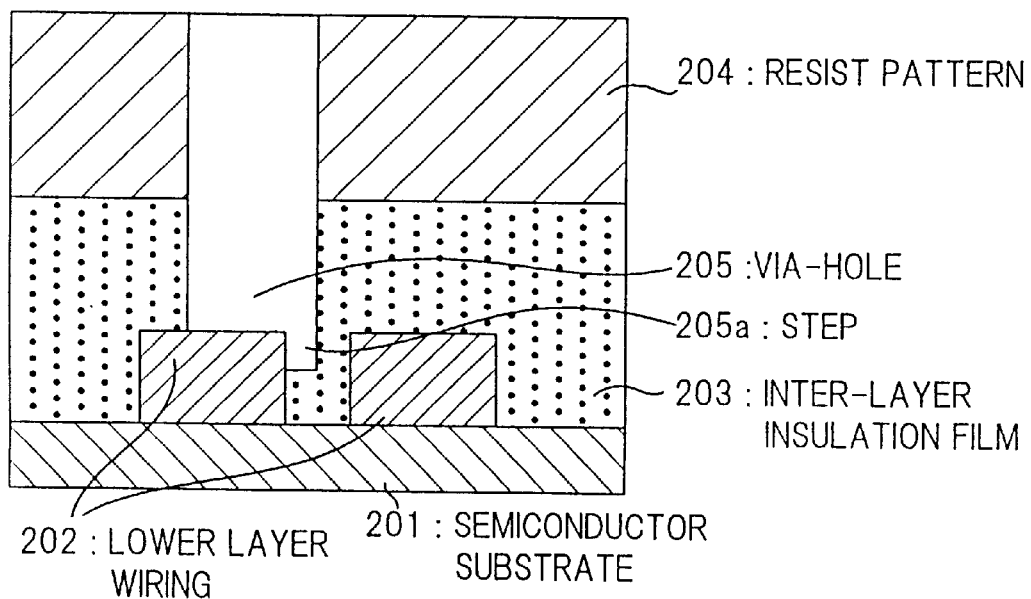
FIG. 12 is a cross section illustrating another example of a prior art check pattern.

On the other hand, when the via-holes are too over-etched in the configuration procedure of the check pattern 21, the bottom of the via-hole 26a extends to a surface of the first check wiring 23a, as illustrated in a cross section of FIG. 9. Therefore, no contrast is observed in the via-hole 26a when the via-holes 26a and 26b are surveyed by the scanning electron-microscope, as illustrated by a plan view of the check pattern 21 of FIG. 10, wherein the surface of the first check wiring 23a is represented by another light area in the bottom of the via-hole 26a other than that of the second check wiring 23b.

As above described, at least two check wirings are provided at different layers so that a bottom of one of the pair of via-holes, the via-hole hole 26a in the example, may be positioned to traverse both the first check wiring 23a and the second check wiring 23b when the via-hole 26a is too over-etched in the configuration procedure thereof. Therefore, excessive over-etching of the via-holes can be easily detected since no contrast is observed in the via-hole 26a by surveying the pair of the via-holes 26a and 26b of the check pattern 21 with the scanning electron-microscope, when the via-holes are too over-etched.

As heretofore described, the check pattern for via-hole opening examination according to the present invention comprises a pair of via-holes, each thereof configured a little shifted inversely from the center line in the width direction of the concerning check wiring so as a part of either bottom of the pair of via-holes to overlap on a surface of the concerning check wiring. Therefore, whether openings of the via-holes are correctly made or not can be easily examined without needing a high-precision positioning when configuring the pair of the via-holes, since either bottom of the pair of via-holes can be positioned to traverse both the concerning check wiring and the insulation film even if the pair of the via-holes is configured with a certain deviation from the desired position to the concerning check wiring.

Further, by confirming difference of the contrasts between the pair of the via-holes, or among either side via-holes of pairs of via-holes, it can be easily detected whether the electron beam is incident vertically to the bottoms of the via-holes.

Still further, the excessive over-etching of the via-holes can be also easily examined by providing an additional check wiring at a lower wiring layer than the wiring layer comprising the basic check wiring and an insulation film in such a way as one of the pair of via-holes may traverse both the basic check wiring and the additional check wiring when the via-holes are too over-etched, in the check pattern of the invention.

What is claimed is:

1. A check pattern for non-contact examining via-hole openings in a multi-layer integrated circuit; said check pattern comprising:

a dedicated check wiring configured on a semiconductor substrate whereof via-hole openings are to be examined;

an insulation film formed on the semiconductor substrate to cover the check wiring; and a pair of via-holes, each of said via-hole being configured at each end of the check wiring, respectively, and positioned slightly shifted inversely with respect to each other from a center line of the check wiring in a width direction of the check wiring, and a bottom of each of said via-holes being positioned to traverse both the check wiring and the insulation film, said dedicated check wiring being unconnected to functional circuit wirings of said multi-layer integrated circuit.

2. The check pattern for non-contact examining via-hole openings as recited in claim 1, wherein each of the pair of via-holes is so designed to have a bottom whereof an overlapped area with the dedicated check wiring is the same with each other.

3. A check pattern for non-contact examining via-hole openings as recited in claim 1, said check pattern further comprising an additional dedicated check wirings at a lower wiring layer than a wiring layer of the dedicated check wiring, said dedicated additional check wiring being so positioned that a bottom of one of the pair of the via-holes should traverse both the dedicated check wirings and the additional dedicated check wiring when the pair of the via-holes is over-etched excessively.

4. A check pattern for non-contact examining via-hole openings in a multi-layer integrated circuit; said check pattern comprising:

more than one dedicated check wiring configured being arranged in series by a first pitch on a semiconductor substrate whereof via-hole openings are to be examined;

an insulation film formed on the semiconductor substrate to cover said more than one check wiring; and pairs of via-holes, arranged in series by a second pitch different from the first pitch, each of said pairs of via-holes corresponding to each of said more than one check wirings, each via-hole of every of the pairs of via-holes being configured at each end of corresponding each of said more than one check wirings, respectively, and positioned slightly shifted inversely with each other from a center line of the corresponding each of said more than one check wirings in a width direction of the corresponding each of said more than one check wirings, and a bottom of said each via-hole being positioned to traverse both the corresponding each of said more than one check wirings and the insulation film, each of said more than one dedicated check wirings being unconnected to functional wirings of said multi-layer integrated circuit.

5. A check pattern for non-contact examining via-hole openings as recited in claim 4, wherein each via-hole of one of the pairs of via-holes is so designed as to have a bottom whereof an overlapped area with corresponding one of said more than one dedicated check wiring is the same with each other.

6. A check pattern for non-contact examining via-hole openings as recited in claim 4, said check pattern further comprising an additional dedicated check wiring at a lower wiring layer than a wiring layer of said more than one dedicated check wirings, said additional dedicated check wiring being so positioned that a bottom of one via-hole of one of the pairs of the via-holes should traverse both corresponding one of said more than one dedicated check wirings and the additional wiring when the pairs of the via-holes are over-etched excessively.

* * * * *